United States Patent
Huang

(10) Patent No.: US 9,560,778 B2
(45) Date of Patent: Jan. 31, 2017

(54) COVER OPERATION MECHANISM

(71) Applicant: HON HAI PRECISION INDUSTRY CO., LTD., New Taipei (TW)

(72) Inventor: Ying-Jui Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/724,806

(22) Filed: May 29, 2015

(65) Prior Publication Data

US 2015/0351269 A1 Dec. 3, 2015

(30) Foreign Application Priority Data

Jun. 3, 2014 (TW) .............................. 103119207 A

(51) Int. Cl.
*H05K 5/02* (2006.01)
*G06F 1/16* (2006.01)
*G06F 1/18* (2006.01)

(52) U.S. Cl.
CPC ........... *H05K 5/0226* (2013.01); *G06F 1/1601* (2013.01); *G06F 1/1656* (2013.01); *G06F 1/181* (2013.01); *H05K 5/0221* (2013.01); *H05K 5/0239* (2013.01)

(58) Field of Classification Search
CPC ...... G06F 1/181; G06F 1/1601; G06F 1/1656; G06F 1/1615; H05K 5/0239; H05K 5/0226; H05K 5/0221; H05K 5/0217; H02G 3/14; E05D 7/00; E05D 11/00; E05D 11/0054; E05D 11/10

USPC .............. 312/319.2, 223.2; 174/66, 67, 542; 361/679.02, 679.31, 679.4, 679.43, 679.55, 361/679.56, 679.58, 814
See application file for complete search history.

(56) References Cited

U.S. PATENT DOCUMENTS

| | | | | |
|---|---|---|---|---|
| 5,458,412 A | * | 10/1995 | Lee | E05D 3/022 312/309 |
| 7,431,408 B2 | * | 10/2008 | Lai | G06F 1/181 312/223.1 |
| 7,639,495 B2 | * | 12/2009 | Chen | G06F 1/181 312/223.2 |
| 8,096,626 B2 | * | 1/2012 | Tang | G06F 1/181 312/223.2 |
| 2012/0235643 A1 | * | 9/2012 | Lin | H02J 7/0044 320/115 |

FOREIGN PATENT DOCUMENTS

| | | |
|---|---|---|
| CN | 102740632 A | 10/2012 |
| TW | M270393 | 7/2005 |
| TW | M306456 | 2/2007 |

* cited by examiner

Primary Examiner — Dimary Lopez Cruz
(74) Attorney, Agent, or Firm — Zhigang Ma

(57) ABSTRACT

A cover operation mechanism includes a case, a cover rotatably coupled to the case, a positioning portion located on the case, and a driver engaged with the positioning portion. The case includes a receiving portion. The cover covers the receiving portion and includes a shaft slidable and mounted in the slot. The driver includes an elastic element. When the cover is covered on the receiving portion, the driver drives the shaft to make the elastic element generate an elastic force. When the cover is disengaged from the receiving portion by an external force, the elastic force drives the shaft to be moved from one end to an opposite end of the slot to open the cover.

18 Claims, 10 Drawing Sheets

COVER OPERATION MECHANISM

FIELD

The subject matter herein generally relates to cover mechanisms, and more particularly to a cover operation mechanism.

BACKGROUND

In generally, cover mechanisms are widely applied to electronic devices to protect external ports of the electronic devices. The cover mechanism includes a cover and a latch engaging with the cover. When the cover is disengaged from the case by an external force, the cover is held open by a user, which is inconvenient for the user to use the ports.

BRIEF DESCRIPTION OF THE DRAWINGS

Implementations of the present technology will now be described, by way of example only, with reference to the attached figures, wherein.

DETAILED DESCRIPTION

Figure 1:
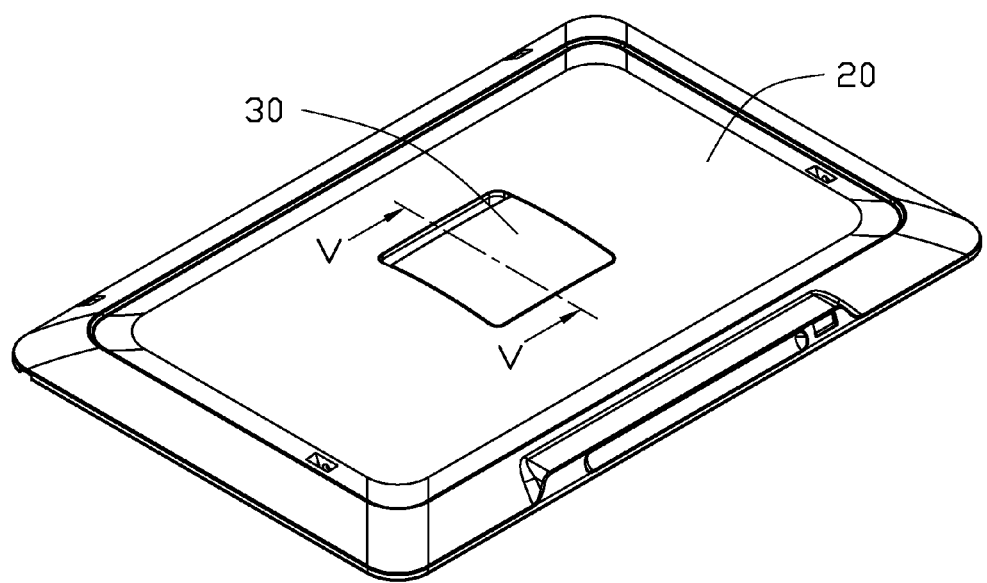
FIG. 1 is an isometric view of a cover operation mechanism.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a cover operation mechanism.

Figure 2:
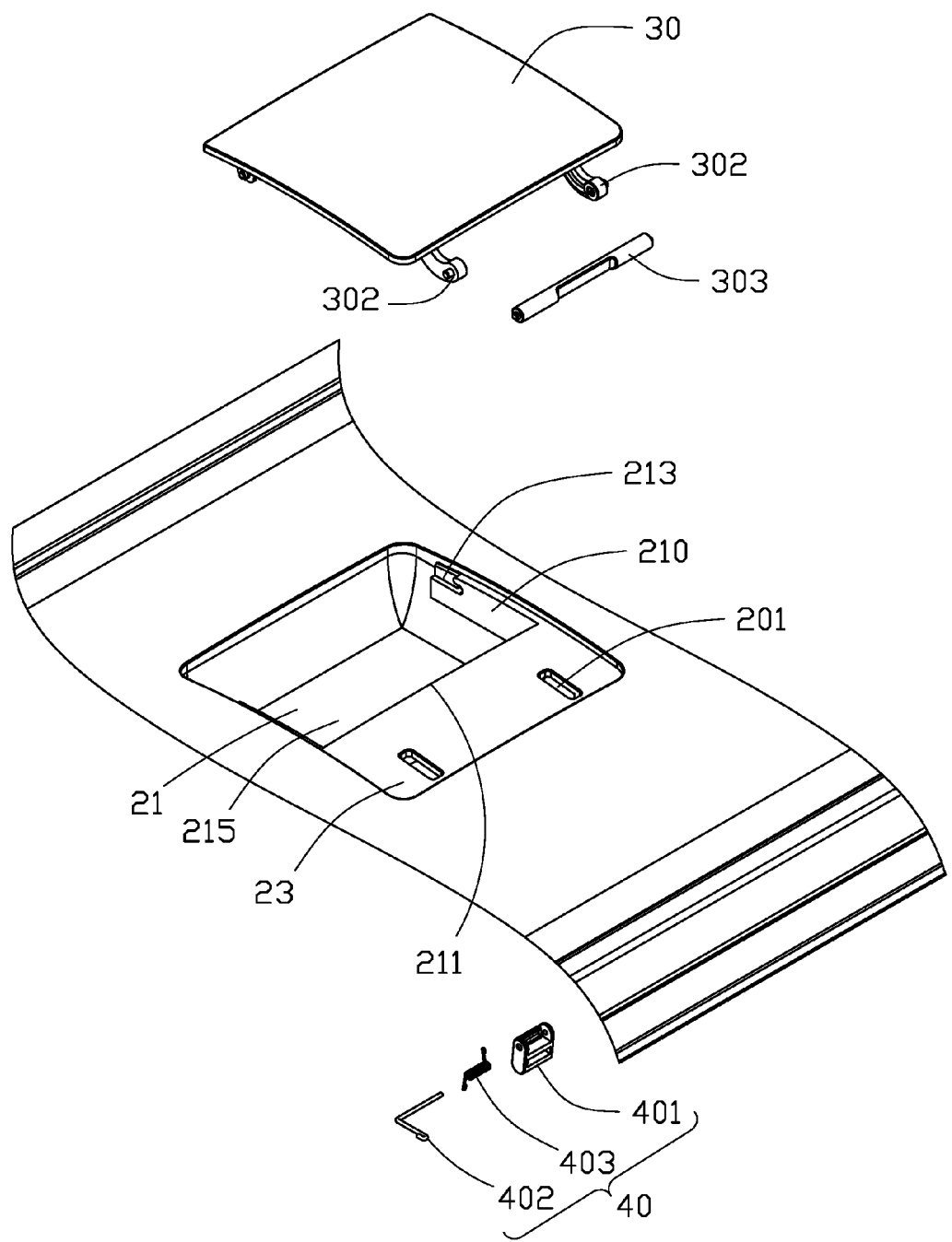
FIG. 2 is an exploded view of the cover operation mechanism of FIG. 1.

FIG. 1 and FIG. 2 illustrate an embodiment of the cover operation mechanism 10. The cover operation mechanism 10 includes a case 20, a cover 30, and a driver 40. The case 20 includes a receiving portion 21 to receive connectors, such as a Universal Serial Bus (USB). The cover 30 is rotatably coupled to the case 20. The driver 40 is received in the case 20 and can drive the cover 30 to be rotated with respect to the case 20 and cover the receiving portion 21. The cover 30 covers the receiving portion 21 to prevent the connectors from being released from the case 20.

Figure 3:
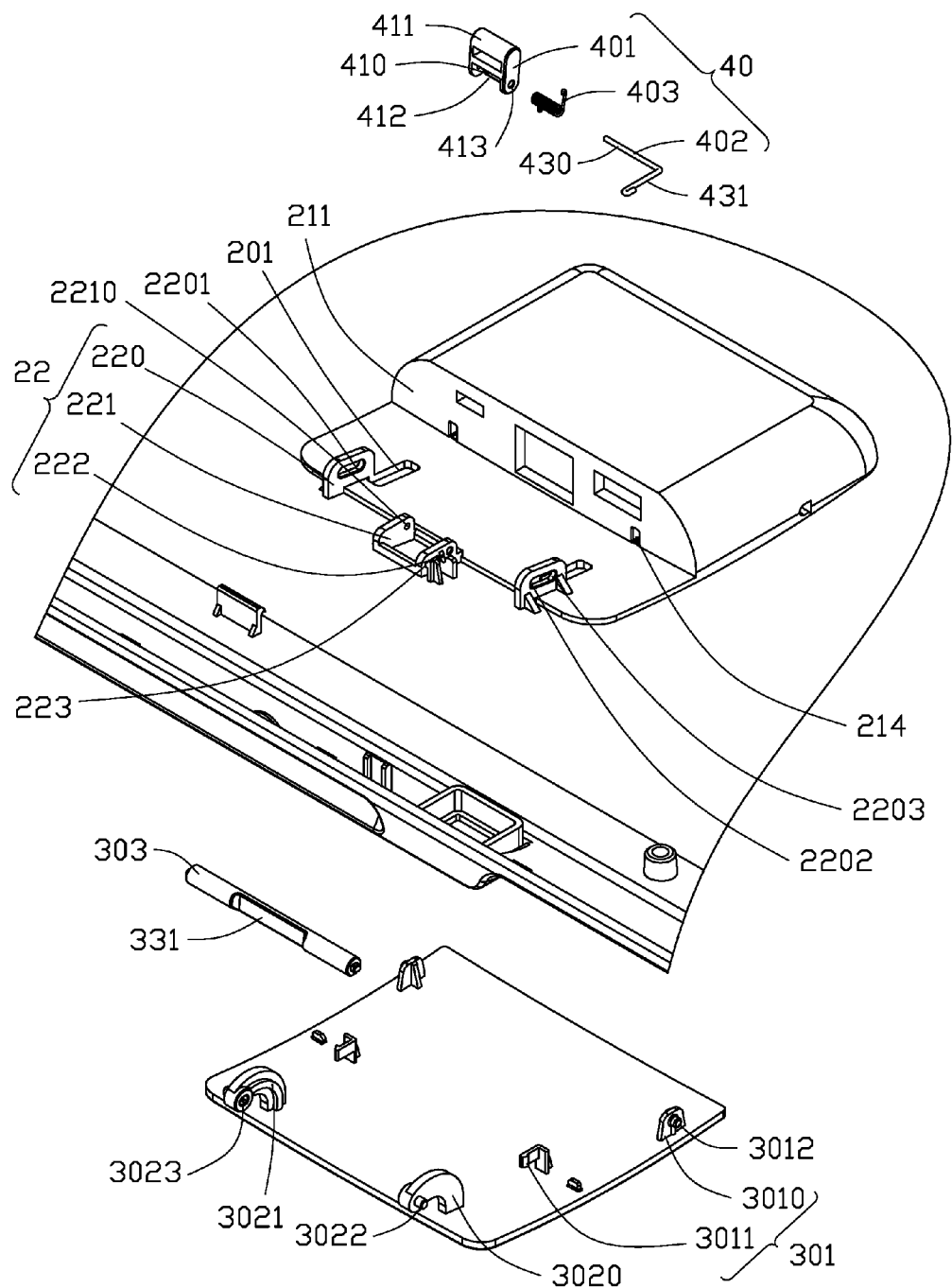
FIG. 3 is an exploded view of the cover operation mechanism of FIG. 1 viewed from another angle.

FIG. 2 and FIG. 3 illustrate that the case 20 defines a sunken portion 23. The sunken portion 23 is rectangular shaped and adjacent the receiving portion 21. The receiving portion 21 includes a pair of first sidewalls 210 and a second sidewall 211 perpendicular to the pair of first sidewalls 210. The pair of first sidewalls 210 and the second sidewall 211 cooperate to define an opening 215. The connectors are received in the opening 215. Each of the first sidewalls 210 defines a first recess 213, and the second sidewall 211 defines two second recesses 214. The first recess 213 is "L" shaped.

A pair of through holes 201 is defined in the sunken portion 23. A positioning portion 22 is defined on a side of the sunken portion 23 opposite to the opening 215. The positioning portion 22 includes a pair of first positioning blocks 220 opposite to each other, a pair of second positioning blocks 221 located between the pair of first positioning blocks 220, and a third positioning block 222 adjacent to the second positioning blocks 221. The pair of first positioning blocks 220 is parallel to the pair of the second positioning blocks 221. Each of the first positioning blocks 220 defines a slot 2201. Two ends of the first positioning block 220 respectively cross the slot 2201 to form a first position 2202 and a second position 2203. The pair of second positioning blocks 221 defines a first positioning hole 2210. A stopping portion 223 protrudes from the third positioning block 222 facing the second positioning block 221.

Figure 4:
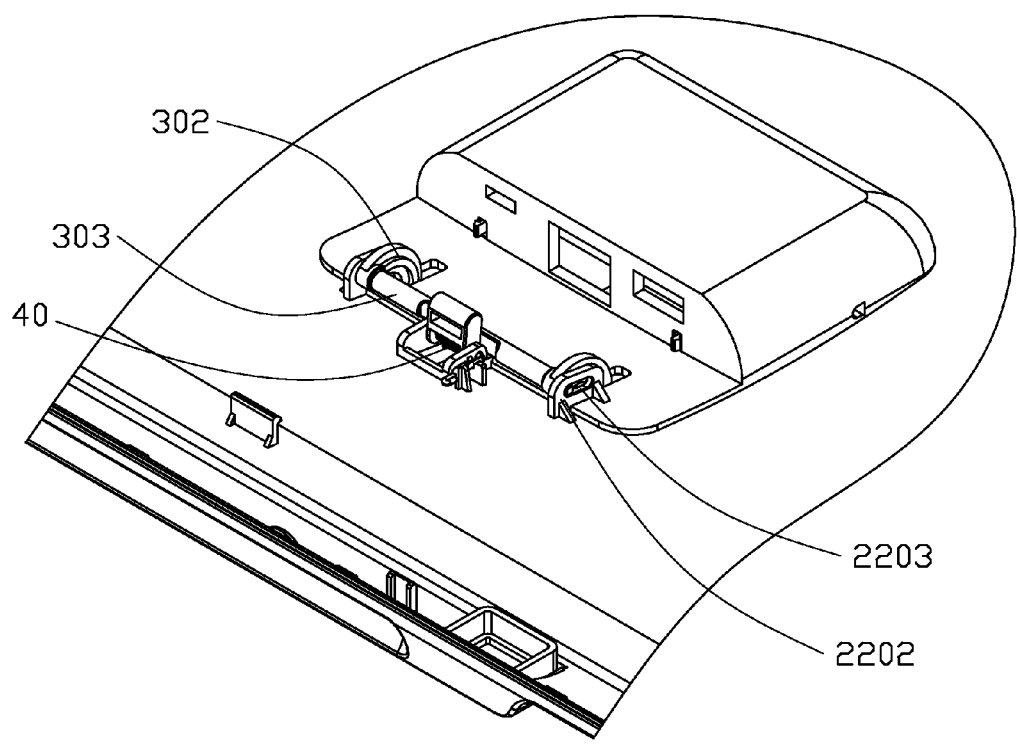
FIG. 4 is an isometric view of the cover operation mechanism of FIG. 1 viewed from an inner side.
Figure 5:
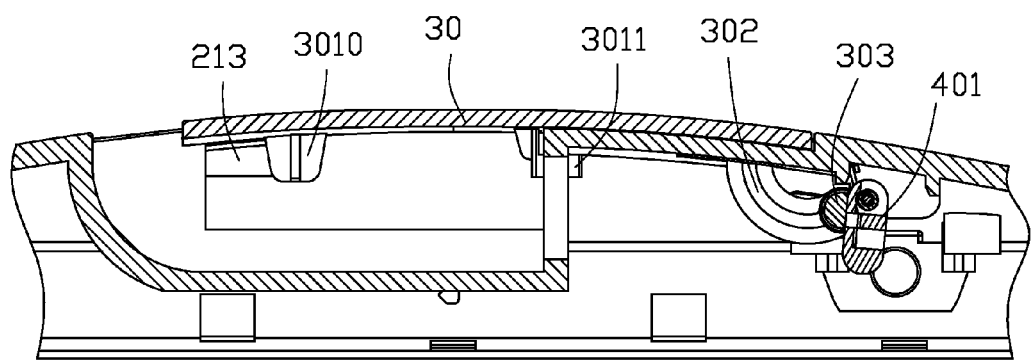
FIG. 5 is a partial cross-sectional view taken along V-V of the cover operation mechanism of FIG. 1.
Figure 6:
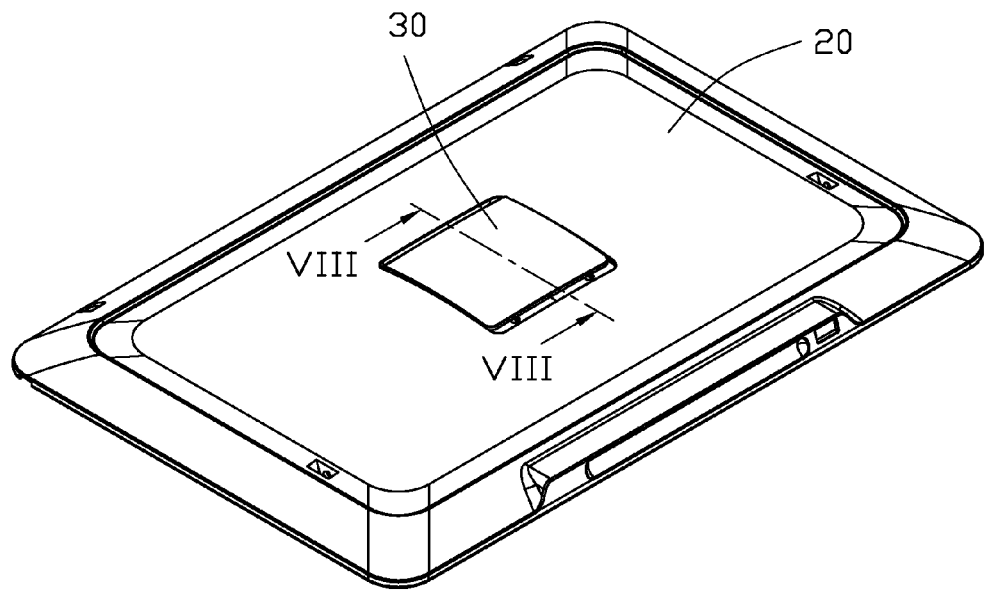
FIG. 6 is an isometric view of the cover operation mechanism in a partial open state of FIG. 1.
Figure 7:
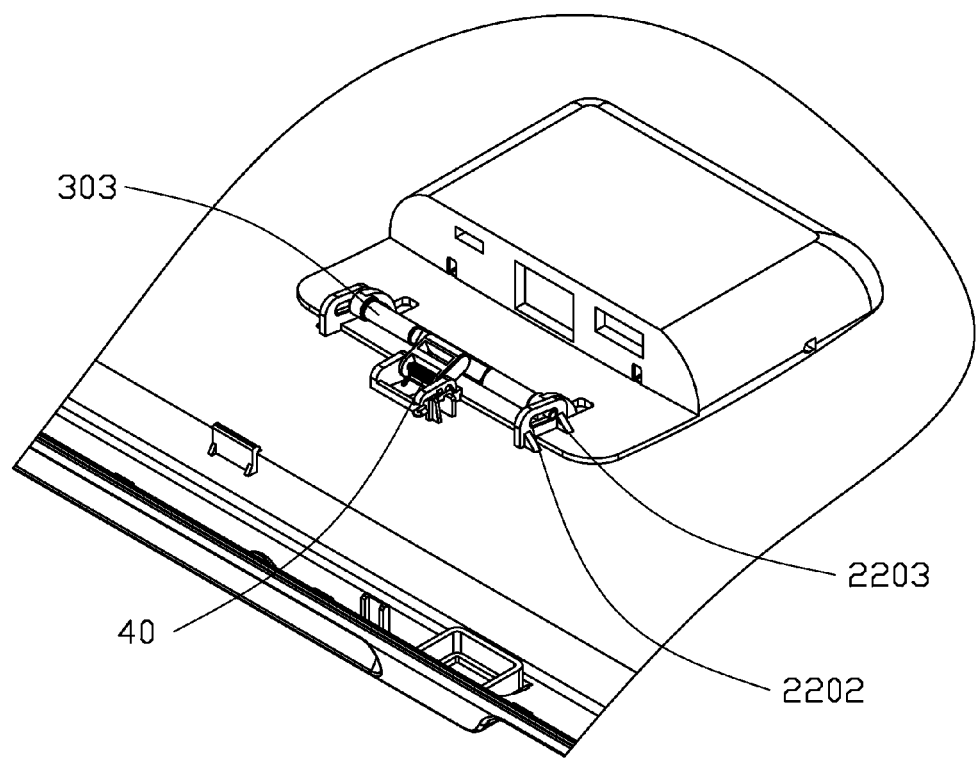
FIG. 7 is an isometric view of the cover operation mechanism of FIG. 6 viewed from an inner side.
Figure 8:
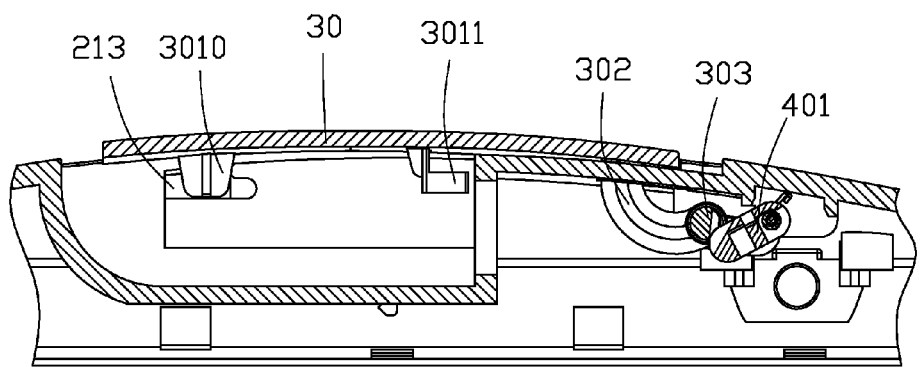
FIG. 8 is a partial cross-sectional view taken along VIII-VIII of the cover operation mechanism of FIG. 6.
Figure 9:
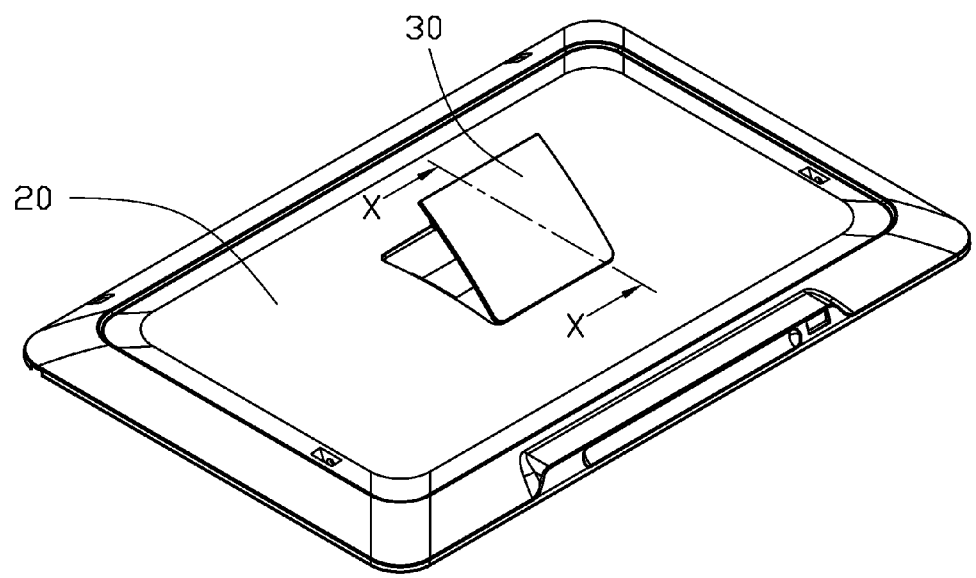
FIG. 9 is an isometric view of the cover operation mechanism in an open state of FIG. 1.
Figure 10:
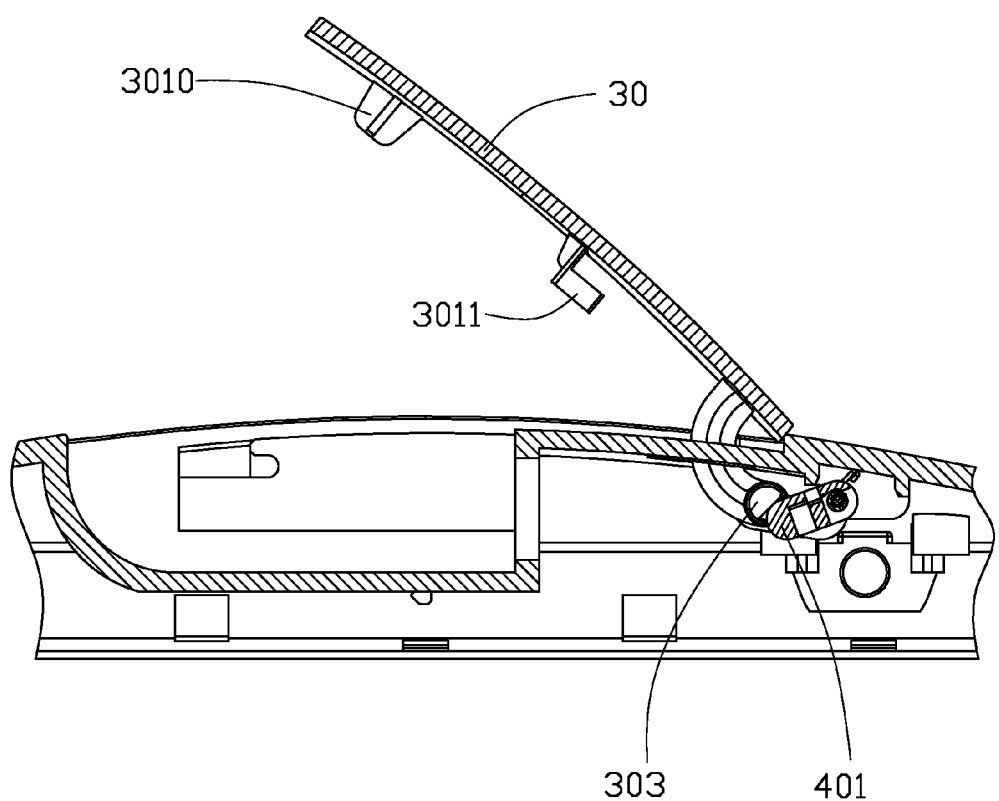
FIG. 10 is a partial cross-sectional view taken along X-X of the cover operation mechanism of FIG. 9.

FIG. 4 illustrates that the cover 30 is fixed on the sunken portion 23 to cover the receiving portion 21 (see FIG. 5). The cover 30 is received in the sunken portion 23 to allow a side of the cover 30 to align with the case 20 when covering the receiving portion 21. The cover 30 includes a latch 301, a pair of connecting arms 302 and a shaft 303. The latch 301 is located on the cover 20 facing the sunken portion 23. The latch 30 includes a pair of first latching portions 3010 engaging with the first recess 213 and a pair of second latching portions 3011 engaging with the second recess 214. A cylinder 3012 protrudes from the first latching portion 3011 and is configured to slide along the first recess 213. The connecting arm 302 is inserted into the through hole 201 and is configured to be coupled to the shaft 303. The connecting arm 302 includes a first surface 3020 and a second surface 3021 opposite to the first surface 3020. An axle 2022 extends outward from the first surface 3021, a connecting portion 3023 is located on the second surface 3021, and the axle 200 is mounted and slidable in the slot 2201. Two ends of the shaft 303 respectively couple to the connecting portion 3023 of the connecting arm 302. A groove 331 is defined in a middle of the shaft 303.

The driver 40 is fixed on the positioning portion 22 to drive the shaft 303 to be rotated. The driver 40 includes a main body 401 rotatably coupled to the case 20, a pin 402, and an elastic element 403 sleeved on the pin 402.

The main body 401 includes a first end portion 410 and a second end portion 411 opposite to the first end portion 410. The first end portion 410 defines a receiving groove 412. A pair of second positioning holes 413 is defined on two walls of the main body 401 surrounding the receiving groove 412. The elastic element 403 is received in the receiving groove 412 coupling the main body 401 to the case 20. The second end portion 411 has a smooth surface, which is resisted by the groove 331 of the shaft 303.

The pin 402 is "L" shaped, and includes a first rod 430 and a second rod 431 perpendicular to the first rod 430. The first rod 430 passes through the first positioning hole 2210, the second positioning hole 413, and the elastic element 403 to make the first end portion 410 of the main body 401 be received between the pair of the second positioning blocks 221. The second rod 431 is latched with the stopping portion 223 of the third positioning portion 222.

FIG. 5 illustrates that the first latching portion 3010 engages with the first recess 213, the second latching portion 3011 engages with the second recess 241 to latch the cover 30 closed. The axle 3022 is located in the first position 2202, the shaft 303 is resisted by the main body 401 to compress the elastic element 403 and generate an elastic force. The main body 401 is perpendicular to the case 20.

FIGS. 6-10 illustrate that when the cover 30 is rotated with respect to the case 20, the cover 30 is open. In detail, the first latching portion 3010 is gradually disengaged from the first recess 213, the elastic force drives the shaft 303 to drive the main body 401, the main body 401 is rotatably driven by the shaft 303 to move the axle 3022 of the connecting arm 302 along the slot 2201 from the first positioning portion 2202 to the second positioning portion 2203. The main body 40 is gradually inclined with the case 20. When the axle 3022 arrives at the second positioning portion 2203, a pivot point is formed to drive the main body 401, the shaft 303 and the cover 30 to be rotated with respect to the case 20 until the cover 30 is out of the receiving portion 21 and open.

The embodiments shown and described above are only examples. Many details are often found in the art such as the other features of a cover operation mechanism. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A cover operation mechanism, comprising:
a case comprising a receiving portion;
a cover rotatably coupled to the case to cover the receiving portion, comprising a shaft;
a positioning portion located on the case and defining a slot, wherein the shaft is slidingly mounted in the slot; and
a driver engaged with the positioning portion, comprising an elastic element, a main body and a pin, the pin is passed through the main body and making the main body to be coupled to the case, and the elastic element sleeved on the pin and coupled to the main body and the case;
wherein when the cover is covered on the receiving portion, the driver drives the shaft to make the elastic element generate an elastic force;
wherein when the cover is disengaged from the receiving portion by an external force, the elastic force drives the shaft to be moved from an end to an opposite end of the slot to open the cover.

2. The cover operation mechanism of claim 1, wherein the elastic element is located in the main body, a first end portion of the main body is rotatably coupled to the case, and a second end portion of the main body is engaged with the shaft.

3. The cover operation mechanism of claim 2, wherein the second end portion has a smooth surface, and the shaft defines a groove engaging with the second end portion.

4. The cover operation mechanism of claim 3, wherein the positioning portion comprises a pair of first positioning blocks, the slot is defined in the first positioning block.

5. The cover operation mechanism of claim 4, wherein the positioning portion further comprises a pair of second positioning blocks located between the pair of the first positioning blocks, and the pin is mounted in the second positioning blocks.

6. The cover operation mechanism of claim 1, wherein the receiving portion is concaved from the case, one of the receiving portion and the cover defines a first recess and the other comprises a first latching portion engaging with the first recess.

7. The cover operation mechanism of claim 6, wherein, a cylinder protrudes from the first latching portion and slides along the first recess to make the first latching portion engage with the first recess or disengage from the first recess.

8. The cover operation mechanism of claim 6, wherein the cover further comprises a pair of connecting arms, the pair of connecting arms is inserted into the case to couple to the shaft.

9. A cover operation mechanism, comprising:
a case comprising a receiving portion, and a sunken portion adjacent to the receiving portion;
a cover rotatably coupled to the sunken portion to cover the receiving portion, comprising a shaft;
a positioning portion located on the case and defining a slot, wherein the shaft is slidingly mounted in the slot; and
a driver engaged with the positioning portion, comprising an elastic element, a main body and a pin, the pin is passed through the main body and making the main body to be coupled to the case, and the elastic element sleeved on the pin and coupled to the main body and the case;

wherein when the cover is covered on the receiving portion, the driver drives the shaft to make the elastic element generate an elastic force and the cover is aligned with the case;

wherein when the cover is disengaged from the receiving portion by an external force, the elastic force drives the shaft from an end to an opposite end of the slot to open the cover.

10. The cover operation mechanism of claim 9, wherein the elastic element is located in the main body, a first end portion of the main body is rotatably coupled to the case, and a second end portion of the main body is engaged with the shaft.

11. The cover operation mechanism of claim 10, wherein the second end portion has a smooth surface, and the shaft defines a groove engaging with the second end portion.

12. The cover operation mechanism of claim 11, wherein the positioning portion comprises a pair of first positioning blocks, the slot is defined in the first positioning block.

13. The cover operation mechanism of claim 12, wherein the positioning portion further comprises a pair of second positioning blocks located between the pair of the first positioning blocks, and the pin is mounted in the second positioning blocks.

14. The cover operation mechanism of claim 9, wherein the receiving portion is concaved from the case, one of the receiving portion and the cover defines a first recess and the other comprises a first latching portion engaging with the first recess.

15. The cover operation mechanism of claim 14, wherein, a cylinder protruding from the first latching portion and slides along the first recess to make the first latching portion engage with the first recess or disengage from the first recess.

16. The cover operation mechanism of claim 14, wherein the cover further comprises a pair of connecting arms, the pair of connecting arms is inserted into the case to couple to the shaft.

17. A cover operation mechanism, comprising:
a case comprising a receiving portion;
a cover rotatably coupled to the case to cover the receiving portion, comprising a shaft;
a positioning portion located on the case and defining a slot, and the shaft slidingly mounted in the slot; and
a driver engaged with the positioning portion, comprising a main body, an elastic element located on the main body, and a pin, the pin is passed through the main body and making the main body to be coupled to the case, and the elastic element sleeved on the pin and coupled to the main body and the case;
wherein when the cover is covered on the receiving portion, the driver drives the shaft to make the elastic element generate an elastic force and the main body is perpendicular to the case;
wherein when the cover is disengaged from the receiving portion by an external force, the elastic force drives the shaft to be moved from an end to an opposite end of the slot to make the cover be opened and the main body is gradually inclined with the case.

18. The cover operation mechanism of claim 17, wherein a first end portion of the main body is rotatably coupled to the case, a second end portion of the main body is engaged with the shaft, the second end portion has a smooth surface, and the shaft defines a groove engaging with the second end portion.

* * * * *